United States Patent
Bach et al.

(10) Patent No.: US 9,503,121 B2
(45) Date of Patent: Nov. 22, 2016

(54) VERY HIGH DYNAMIC-RANGE SWITCHED CAPACITOR ADC WITH LARGE INPUT IMPEDANCE FOR APPLICATIONS TOLERATING INCREASED DISTORTION AND NOISE AT LARGE INPUT SIGNAL LEVELS

(71) Applicant: Infineon Technologies AG, Neubiberg (DE)

(72) Inventors: Elmar Bach, Villach (AT); Patrizia Greco, Villach (AT); Snezana Stojanovic, Wernberg (AT); Dietmar Straeussnigg, Villach (AT)

(73) Assignee: Infineon Technologies AG, Neubiberg (DE)

( * ) Notice: Subject to any disclaimer, the term of this patent is extended or adjusted under 35 U.S.C. 154(b) by 216 days.

(21) Appl. No.: 14/516,736

(22) Filed: Oct. 17, 2014

(65) Prior Publication Data

US 2016/0112795 A1   Apr. 21, 2016

(51) Int. Cl.
   *H03M 3/00*   (2006.01)

(52) U.S. Cl.
   CPC .............. *H03M 3/464* (2013.01); *H03M 3/34* (2013.01); *H03M 3/356* (2013.01); *H03M 3/424* (2013.01); *H03M 3/458* (2013.01)

(58) Field of Classification Search
   CPC .................. H03M 7/3004; H03M 3/50; H03M 3/30; H03M 3/464; H03M 3/356; H03M 3/34; H03M 3/424; H03M 3/454; H03M 3/438
   USPC .................................................. 341/143, 155
   See application file for complete search history.

(56) References Cited

U.S. PATENT DOCUMENTS

| | | | | |
|---|---|---|---|---|
| 4,110,705 A | * | 8/1978 | Crouse ................. | H03M 3/022 341/143 |
| 4,393,369 A | * | 7/1983 | Davies ................... | H03M 1/48 341/139 |
| 4,961,045 A | * | 10/1990 | Gray ....................... | G05F 1/468 323/273 |
| 2010/0238146 A1 | * | 9/2010 | Zebedee ............... | H03M 1/687 345/205 |
| 2012/0033719 A1 | * | 2/2012 | Chen ...................... | H03C 5/00 375/224 |
| 2012/0040630 A1 | * | 2/2012 | Chen ...................... | H03C 5/00 455/108 |

* cited by examiner

*Primary Examiner* — Jean B Jeanglaude
(74) *Attorney, Agent, or Firm* — Eschweiler & Associates, LLC (57) ABSTRACT

A modulator is configured to respond to input swings by providing a feedback voltage via a feedback path to compromise an increase in noise and distortion power with increasing signal power at signal levels exceeding a predetermined threshold. A digital-to-analog converter (DAC) generates a feedback voltage with a resistor string biased with a given current and switches as a function of an input value to mitigate the voltage swing at a summing node.

25 Claims, 8 Drawing Sheets

VERY HIGH DYNAMIC-RANGE SWITCHED CAPACITOR ADC WITH LARGE INPUT IMPEDANCE FOR APPLICATIONS TOLERATING INCREASED DISTORTION AND NOISE AT LARGE INPUT SIGNAL LEVELS

FIELD

The present disclosure relates to analog to digital converters (ADCs), and more specifically, to switched capacitor ADCs that are capable of processing a large input signal range while having a high input impedance for applications tolerating increased distortion and noise at large input signal levels, e.g. in audio systems.

BACKGROUND

A trend in high-performance audio recording technology is to support very high dynamic ranges in the sound pressure level (SPL), which is commonly measured in dB in comparison to the threshold of human hearing as a standard reference level. The lower limit of audibility at a pressure level of 20 µPa (rms) is defined as an SPL of 0 dBSPL. Sound level measurements can be made relative to this level. For example, a pressure level of 1 Pa (rms) equals to an SPL of 94 dBSPL. An upper SPL limit may not be clearly defined and can depend on the desired application range. One problem of engineering audio systems or microphone systems is to provide architectures that accommodate large dynamic ranges with low power consumption. Therefore, there is a need to design audio systems and components to process the high SPL levels efficiently.

DETAILED DESCRIPTION

The present disclosure will now be described with reference to the attached drawing figures, wherein like reference numerals are used to refer to like elements throughout, and wherein the illustrated structures and devices are not necessarily drawn to scale. As utilized herein, terms "component," "system," "interface," and the like are intended to refer to a computer-related entity, hardware, software (e.g., in execution), and/or firmware. For example, a component can be a circuit, a processor, a process running on a processor, a controller, an object, an executable, a program, a storage device, a computer, a tablet PC and/or a mobile phone with a processing device. By way of illustration, an application running on a server and the server can also be a component. One or more components can reside within a process, and a component can be localized on one computer and/or distributed between two or more computers. A set of elements or a set of other components can be described herein, in which the term "set" can be interpreted as "one or more."

Further, these components can execute from various computer readable storage media having various data structures stored thereon such as with a module, for example. The components can communicate via local and/or remote processes such as in accordance with a signal having one or more data packets (e.g., data from one component interacting with another component in a local system, distributed system, and/or across a network, such as, the Internet, a local area network, a wide area network, or similar network with other systems via the signal).

As another example, a component can be an apparatus with specific functionality provided by mechanical parts operated by electric or electronic circuitry, in which the electric or electronic circuitry can be operated by a software application or a firmware application executed by one or more processors. The one or more processors can be internal or external to the apparatus and can execute at least a part of the software or firmware application. As yet another example, a component can be an apparatus that provides specific functionality through electronic components without mechanical parts; the electronic components can include one or more processors therein to execute software and/or firmware that confer(s), at least in part, the functionality of the electronic components.

Use of the word exemplary is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form. Furthermore, to the extent that the terms "including", "includes", "having", "has", "with", or variants thereof are used in either the detailed description and the claims, such terms are intended to be inclusive in a manner similar to the term "comprising".

In consideration of the above described deficiencies of audio systems for functioning audio components with large dynamic ranges and low power, an audio system, a switched capacitor modulator, or an analog-to-digital converter (ADC) is described that generates compromises in noise and distortion to facilitate a signal-to-noise-and-distortion ratio (SNDR) at high input levels that is lower than the theoretically obtainable SNDR at the same signal levels in relation to an SNDR of an ideal converter. For example, a switched capacitor modulator of an audio system includes a modulating path that receives an input signal such as an analog input signal and modulates the input into a modulated digital output. A feedback path joins the modulated output to an input terminal of the modulator path. A floating voltage source feedback digital to analog converter (DAC) is configured to generate a floating voltage source as a function of an input swing at an analog input. The DAC modifies the floating voltage as a feedback or a sliding voltage based on an input signal value and a control signal from the digital output. The feedback voltage is provided as a floating voltage to the modulator path and is dynamically adjusted by the DAC to minimize the input signal swings at a summing node. For example, in response to the input signal voltage increasing in magnitude value, the feedback voltage is increased and a negative feedback applied by the feedback DAC at the summing node.

A high-dynamic range system often does not require large SNDR at higher input signal levels. Acoustic systems, for example, do not usually require large SNDR at SPL levels above ~110 dBSPL. The systems disclosed therefore can operate to compromise the obtainable SNR, which is largely due to analog noise. Because of the human hearing perception, relatively large distortion levels such as total harmonic distortion (THD) at SPL levels above 120 dBSPL can be acceptable, which enables further optimizations to the audio system. Additional aspects and details of the disclosure are further described below with reference to figures.

Figure 1:
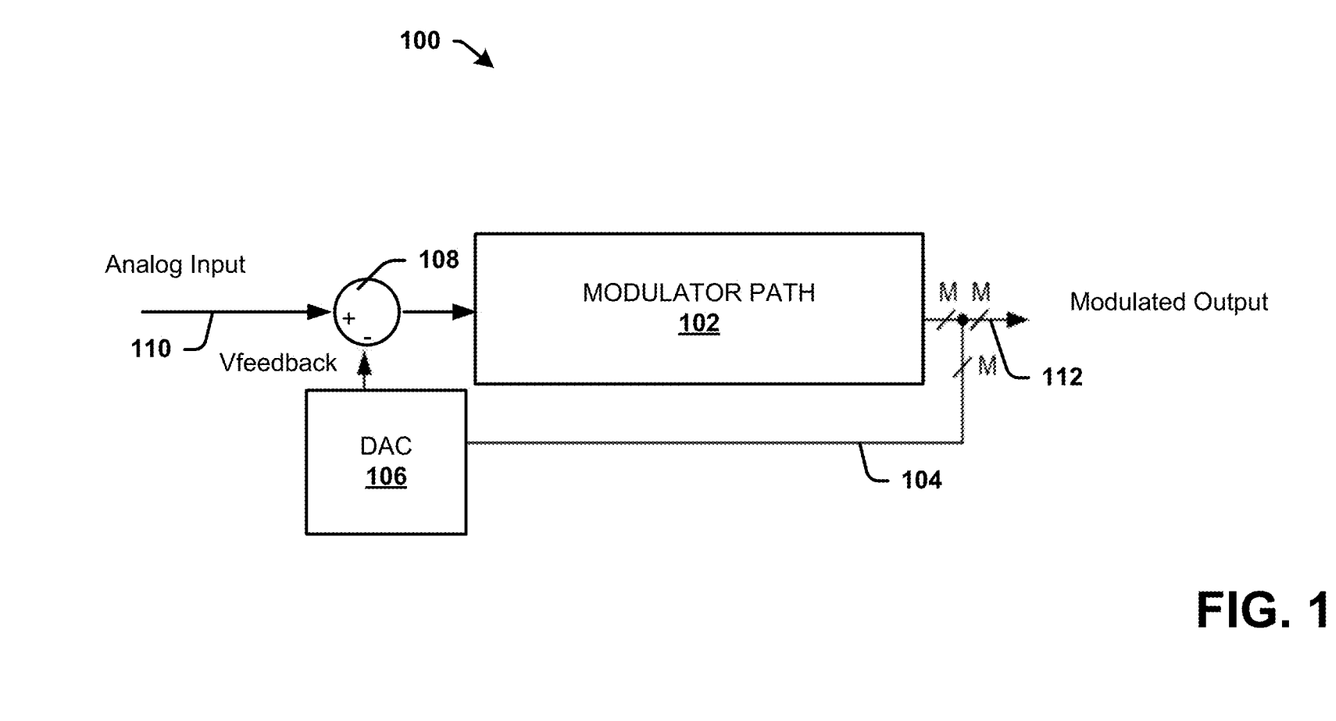
FIG. 1 is a block diagram illustrating an A/D converter system in accordance with various aspect disclosed.

FIG. 1 illustrates an example of an A/D modulator system that generates a floating voltage source to a modulator path for a feedback voltage in accordance with various aspects described. The modulator system 100 operates to accommodate large voltage swings at an analog input 110 via a DAC 106 by mitigating these swings in a summing node 108 to provide a significantly smaller signal value than received to the input of the modulator path 102. The modulator system 100 comprises a modulator such as a delta-sigma modulator or other like modulator that can operate to process one bit or more bits concurrently (at about the same time) to generate a modulated signal output 112 with a modulator path 102 and a feedback path 104.

The modulator system 100 comprises the modulator path 102 and a feedback path 104 to form a modulator device that functions to generate the modulated digital output 112 as part of encoding processes by one or more modulator components within each path to facilitate encoding of analog signals into digital signals. Each path of the system 100, the modulator path 102 and feedback 104, include modulating components coupled within pathways or communication channels to convert, shape, filter, sample or modulate an analog input 110 to generate the modulated digital output 112. The paths can comprise one or more communicating channels or communicating pipelines, which can include similar components as one another for processing.

The analog input 110 can be proportional to an audio signal such as a continuous audio wave that varies depending upon the detection of an audio signal from an audio source by a sensor, such as a microelectromechanical sensor (MEMS), acoustic sensor, or other like sensor component, or a buffered sensor signal as described and illustrated further infra. Such combination with the modulator system 100 forms a digital microphone for use in e.g. audio recording in a mobile device, such as a mobile phone, a tablet or a notebook PC or other like device. Thus, the microphone can be configured to operate with SPLs as high as 140 dBSPL or greater and can deliver the digital output 112 to a system microcontroller unit, for example. In combination with a sensor device (electret or MEMS microphone), an integration of system 100 and an analog processing block to buffer the MEMS output or other sensor output on an ASIC (not shown) can perform the signal readout and analog-to-digital conversion of such audio system.

In one aspect, a maximum SPL of about 140 dBSPL can be achieved via the modulator 100, and thus, the dynamic range target for the microphone can be about 140 dB, for example. This target can be dynamically varied as an increase or a decrease such as, for example, being relaxed to allow some amount of noise at lower SPL levels. Microphone devices comprising the system 100, for example, can deliver a signal-to-noise ratio (SNR) exceeding 66 dB, with respect to an SPL of 94 dBSPL (1 Pa). For this SNR, a lowest detectable SPL could be 28 dBSPL corresponding to a dynamic range of about 112 dB, for example, with a maximum input level of about 140 dBSPL. Other ranges are also envisioned as one of ordinary skill in the art can appreciate.

The feedback path 104 is coupled to the modulated digital output 112 and to the analog input 110 via a summing node 108, and can operate to provide a predetermined threshold onto SNR levels by which compromises in noise power are accepted. For example, the DAC 106 integrates the feedback path 104 to the modulator path 102 via the summing node 108 that operates to dynamically affect input signals as a function of input voltage swings. Assuming a voltage mode operation, the DAC 106 is configured to operate as a voltage source to the modulator path 102 and generates a feedback voltage Vfeedback to the summing node 108 that shifts a summing node voltage value (e.g., amplitude) as a function of the modulated digital output 112.

The DAC 106 operates to adjust the feedback voltage Vfeedback as a function of the modulated output 112, which further reflects a voltage value or a voltage swing of the analog signal at the analog input 110 via the summing node 108. For example, if the input signal voltage increases in value, the floating voltage is increased and a negative feedback voltage is generated by the DAC 106 and applied to the modulator path 102 via the summing node 108 as a result of feedback of the modulated digital output 112. Additionally, if the input voltage decreases or becomes negative, the DAC 106 can operate to generate a negative feedback voltage that comprises a value configured to maintain the voltage signal at the input of modulator path 102, for example.

The DAC 106 can facilitate the generation of an analog noise and distortion contribution that depends on the signal value of the analog signal (analog input voltage) at the analog input 110, and thus is able to compromise the SNDR (THD)/SNR levels of the modulated output 112 at higher input signal levels such as by compromising SNR at about 100 dBSPL or greater (e.g., about 112 dB) or compromising THD at about 104 dBSPL or greater. As such, the DAC 106 is configured to predetermine a cap or a limit set on the SNDR/SNR levels so that as input signal power increases the SDNR/SNR levels are provided by a governor, or partially inhibited from increasing in level. For example, a cap of the SDNR/SNR can be generated by the DAC at a particular input voltage power level, such as at about −36 dBfullscale (dBFS). The cap or limit provided by the DAC 106 can thus inhibit or moderate a further increase of the SDNR/SNR beyond these reference levels. An increase in the noise power or THD is thus allowed as signal power increases, which operates to lower or impede the SNDR/SNR levels. These compromises, for example, are further detailed below and can operate to cap, mitigate or reduce the linear increase of the levels of SNDR, THD or SNR as input signal levels raise above or satisfy a predetermined threshold.

In addition, the threshold can be selected according to the application of the modulator 100 according to one or more predetermined criteria. For example, based on an application, such as an acoustic application or a system specific reference level, e.g. 94 dBSPL, the threshold can be set with a margin above this reference level, e.g. at 104 dBSPL, such that an increase of the SNDR/SNR above this threshold is compromised.

Figure 2:
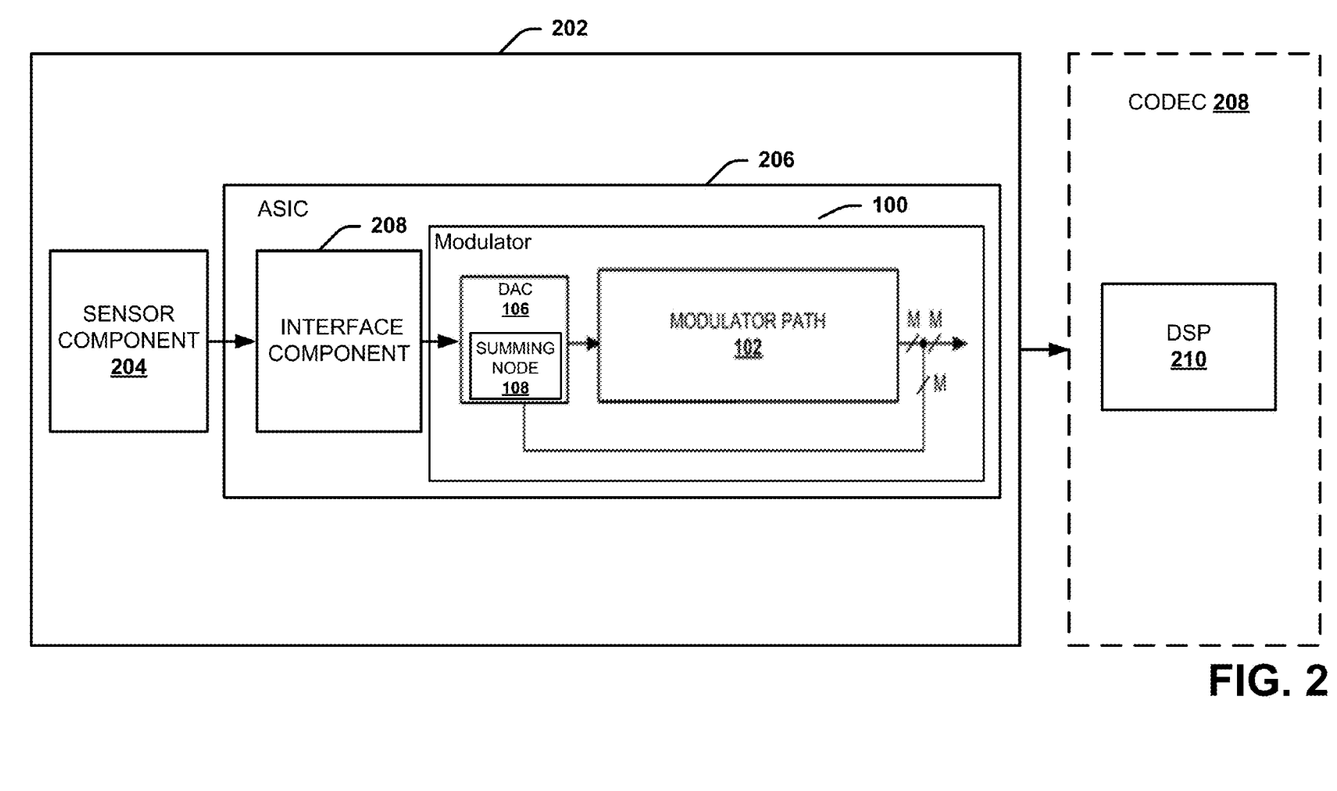
FIG. 2 is a block diagram illustrating an audio system in accordance with various aspects described.

Referring now to FIG. 2, illustrated is an example audio system 200 that operates to facilitate modulation of high dynamic signal ranges in accord with various aspects described. The audio system 200 can embody audio components of an audio device, which can include, a recording device (e.g., a microphone, a digital recorder, or the like), a computer system having a processor and memory, a mobile device, or like device configured to operate sound recording and communications within audio ranges. The audio system 200 comprises the modulator components described above along with additional components.

The audio system 200, for example, can comprise a silicon microphone (SIMIC) 202, or other sound detecting modulating device, a receiving component or client side component having a CODEC 208. Although a silicon microphone is discussed, other microphone types or audio devices detecting audio signals are also envisioned as one of ordinary skill in the art can appreciate. The SIMIC 202 comprises a sensor component, such as an acoustic sensor or a MEMS component 204, for example, that operates to generate an analog signal according to a change in a membrane resulting in a differential (e.g., voltage or signal differential) being generated from audio signals acting upon a diaphragm or a membrane, for example. The sensor 204 can operate to provide input voltage signals to an application specific integrated circuit (ASIC) 206. The ASIC 206 operates to receive voltage signals at an input to perform signal readout and an analog-to-digital conversion. The ASIC 206 operates to handle a large dynamic signal range at low power consumption levels. The ASIC 206 processes signals from the sensor component 204 via an interface circuit 208, comprising, e.g., of a high-impedant biasing network and a buffer, amplifier or attenuator for buffering the MEMS signal or other sensor signal, for example. Limitations in voltage swing can be overcome by setting the supply level of the MEMS interface circuit high enough, by utilizing an internal multiplication of a regulated supply voltage, for example, which is further discussed infra. The ASIC 206 responds to high SPL levels or an increasing voltage swing by compromising SNR/SNDR at these higher levels.

The ASIC 206 and the sensor component 204 can be integrated in a single acoustic package. The ASIC receives signals that can be a single point or a differential signal having differential signal paths for different polarities, in which the sensor component 204 can be a single plate or a dual plate MEMS respectively for sensing signals.

In one aspect, the ASIC 206 comprises a single DAC 106 that operates as a feedback component to the modulator path 102 to cover the full dynamic range. The modulator path 102 and the feedback path 104 with the DAC 106 form an A/D system or a modulator (e.g., a delta-sigma modulator) to facilitate processing of sensor device signals as a function of different SPL signal levels, and thus accommodate processing of entire ranges dynamically or in real time based on the input being received. In this manner, only a single ADC component within the modulator path 102, as well as a single modulator path 102, is utilized to process both high SPL levels and low SPL levels and adapt to changes or swings in MEMS signal. Thus, a single modulator 100 suffices to process the full dynamic range, e.g., 112 dB, while providing high SNR at low input signal levels and sufficient THD and SNR at high signal levels. In contrary, systems may comprise more than one ADC, e.g. a low and a high gain ADC in a parallel connection, to handle the high dynamic range. By avoidance of multiple signal paths (through parallel ADCs) and handovers from one to the other, ADC errors (e.g., dynamic offset changes or glitches) can be avoided, which are not accepted in systems (e.g., audio systems) built on such ADC structures. Within modulator path 102 multiple connections or signal paths can lead to a single ADC (or quantizer) while dynamically adjusting to various SPL levels in processing feedback (feedback path 104) with the single DAC 106 and summing node 108. In addition, handovers are not utilized from one ADC or one pathway to another via a switch or multiple terminals at the ASIC 206 or at a DSP 210 of the CODEC 208. Therefore, a single data stream or data pipeline is provided along the modulated path 102 for signal processing, while dynamically adjusting the processing of the analog input signals with the DAC 106 in the feedback path 104.

As stated above, the modulator path 102 and the DAC 106 of the feedback path 104 process sensor device signals from the sensor component 204 as a function of different SPL signal levels. For example, a low signal level can be defined as those signals received that are at or below a particular reference point, while a high signal level is considered at or above the reference point. The reference point can be defined as a threshold level for a signal value such as amplitude (e.g., voltage amplitude, or other amplitude). The threshold level can be an input signal power threshold in dBFS units, i.e. in reference to the ADC's full-scale level, for example. Above this reference point, and with an added margin of about, for example, 6 or 10 dB, a deterioration of the obtainable SNR and/or increased distortion (THD) can be accepted. The reference point is typically defined by an application of the described system, for example in an acoustic system the sound pressure equal to 1 Pa (94 dBSPL) is one common reference level. Thus compromises in distortion and/or noise can be applied, e.g., at SPL levels above 100 dBSPL or 104 dBSPL and thus cap SNDR/SNR to lower levels as opposed to systems desiring a constant noise power and minimum distortion with an increase in input signal amplitude, resulting in a static increase of SNR and/or SNDR.

Figure 3:
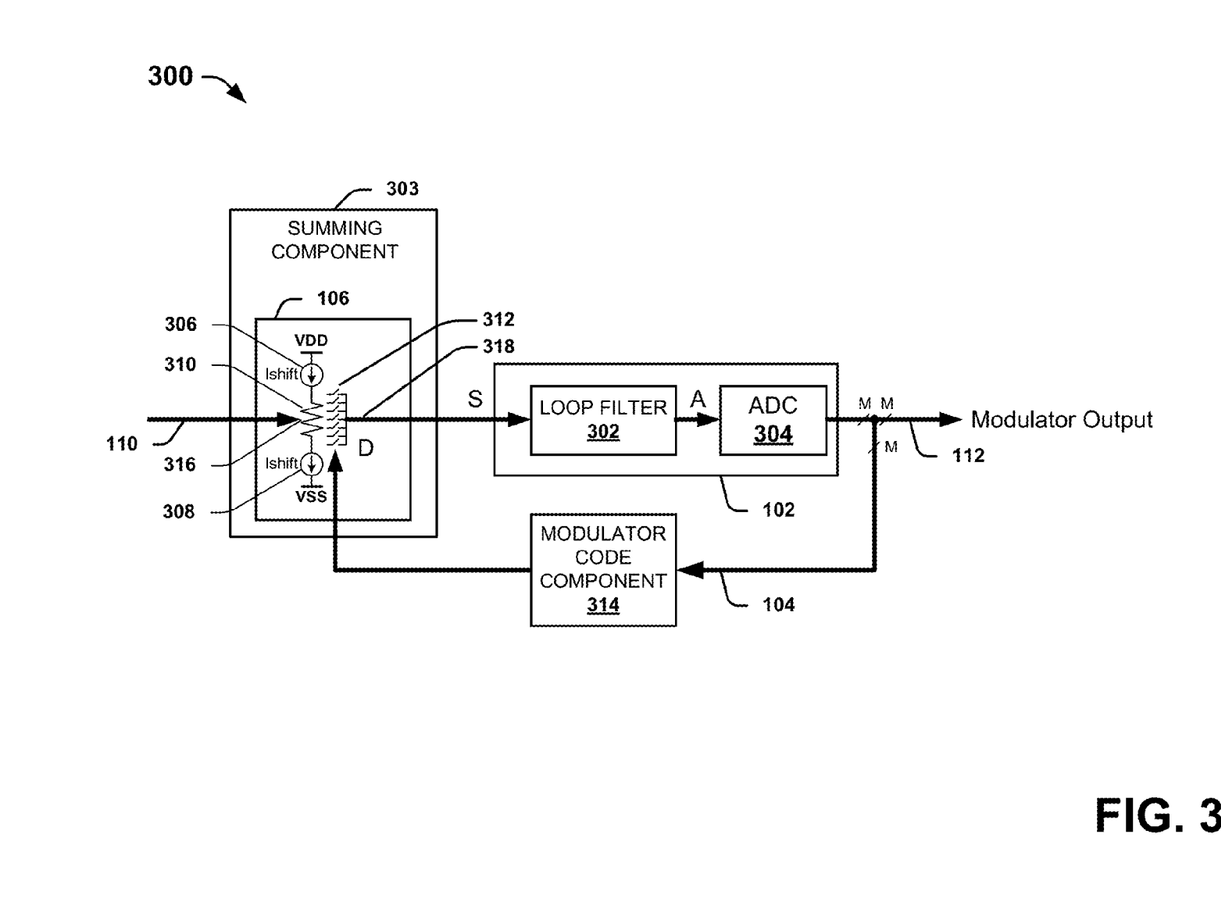
FIG. 3 is a block diagram illustrating another A/D modulator system in accordance with various aspects described.

Referring now to FIG. 3, illustrated is an A/D modulator system with further detail in accordance with various aspects being described. The modulator system 300 comprises the modulator path 102 having a loop filter 302 and an analog to digital converter (quantizer) 304. The feedback path 104 includes a modulator code component 314, which generates control signals for the feedback DAC 106, which is merged with the summing node 108 into a single summing component 303. Therein the DAC 106 comprises a first current source 306 and a second current source 308. In one aspect, the DAC 106 can comprise an R-shift digital-to-analog converter, in which the DAC 106 can have a constant power supply current that is utilized with a plurality of resistors. The DAC 106 further comprises a plurality of switches 312, connected to the DAC resistors, to generate various voltage levels as a function of the state of the modulator output code (M), which is converted to a switch control signal by the modulator code component 314. These voltage levels can be increased or decreased according to a stepping function, for example. The DAC 106 further comprises a set of resistors 310, forming a string of resistors, and a set of switches 312 that control the resistors 310 to provide one or more different voltages levels as a function of a digital signal M received along the feedback path 104.

The first current source 306 can be configured as a constant shift current source and the second current source 308 can be a constant current sink. The DAC 106 is configured as a floating-voltage-source R-shift feedback-DAC that enables or modifies one or more resistor paths dynamically to set a feedback voltage that is subtracted from the input voltage to provide a resulting signal as a summing signal or summing node voltage S. A current can be provided by the two current sources Ishift 306 and 308. In one aspect, the currents Ishift are equal, identical, similar or about the same to one another. The analog input 110 can be connected to the center or an approximate center of a resistor string 310, which is tied between the two current sources 306 and 308; although depicted as a single resistor, the resistor string 310 can comprise one or more resistors as a set of resistors. Switches 312 connect to the taps of the resistor string and are controlled by the modulator code component as a function of the control signal M.

The analog input 110 can be kept from being loaded immediately because the current 306 that is sourced at the top of the resistor string 310 is sunk to the bottom of the resistor string 310. Through switches 312 being steered by a modulator code component 314, a selection of a signal offset to the analog input node or terminal 110 is accomplished by the modulator 300. The offset, for example, can comprise a voltage offset that is facilitated or modified as a function of the shift current Ishift and a total resistance of the resistor string 310, such as between a center tap 316 and a selected output tap 318 of the switching complex 312, for example. The switches can be modified to control a location of the output tap 318 according to the resistors selected to be configured for voltage modification.

The resistance between the center tap 316 connected to the analog input 110 and the selected output tap 318 depends on and is a function of the value of the desired feedback voltage (Vfeedback). Because a feedback voltage value as generated by the DAC 106 monotonically increases towards higher offsets by a series connection of resistors, a small shift current Ishift is sufficient to generate a large voltage offset. The resistors of the resistor string 310 can comprise unit resistors that lead to a linear increase, but alternatively or additionally can vary in value to form a non-linear increase in voltage between the taps depending upon design specifications. Furthermore, the shift current operates as a constant load on a supply VDD, and thus, enables the use of on-chip generated (charge pumped) supplies, particularly in cases where a higher dynamic range is supported.

For example, supply voltages to the summing component 303 can be increased to about 2.7 V or greater in order to at least double possible full-scale input voltage, if the same supply voltage is also used in the interface component 208 (e.g., a MEMS interface component). The feedback DAC 106, however, mitigates the high input voltage swing occurring with an increase of sound pressure level by dropping the voltage levels at the summing node S to a lesser voltage signal as an altering variable or sliding variable to be processed by the modulating path 102. Thus the modulator path 102 can be supplied by much smaller voltages (e.g., 1.5 V). Therefore, lower power consumption can be facilitated, while ensuring voltage levels are moderated in accounting for voltage swings at node S.

In one aspect, the modulator path 102 and the feedback path 104 formulate a modulator configured to ensure that a resistance of the resistor string 310 of the DAC 106 in series to the input signal 110 is a function of a modulated digital output 112. The total resistance increases with larger input signal values (positive or negative) and is dynamically modified by the DAC 106 by putting one or more resistance components in series with the input 110 and the modulator path 102. Therefore, the noise contributed by the DAC 106 is not constant, but rather alters according to an input signal dependency. More noise can be generated by the DAC 106 at higher signal levels, such as at about 100 dBSPL or greater, than at lower levels. For example, the modulator system 300 can operate to compromise the SNR and/or the SNDR (THD) at higher input signals, such as above a threshold or level, in which the threshold level can be defined in relation to the modulator system's full-scale level. For example, given a noise reference at 1 Pa sound pressure (94 dBSPL or −46 dBFS referred to ADC's full-scale) a threshold level at which DAC noise is allowed to increase can be set (e.g., 10 dB above 94 dBSPL). This can be achieved by choosing a sufficiently large LSB voltage level of DAC 106 such that the multi-bit modulator path is in single-bit operation (i.e. toggling only the LSB level in the modulator output code M 112 for signal levels below 104 dBSPL. The system 300 can operate to compromise SNR (or THD) above the threshold level, which can cause the SNR or THD curve to not be linear and roll off, for example.

In another aspect, the DAC 106 can provide an equidistant step size, such as by using same or similar resistors per step of the signals, in which the noise can increase with a square root of the number of the added resistors while the input signal increases linear. The effective SNR is thus changing with a square root behavior. This is illustrated and further described infra with respect to FIG. 4, in which a compression of the SNR at higher signal levels can be facilitated via the DAC 106. Thus, a low power consumption of the floating-voltage-source R-shift DAC 106 implemented at the modulator path 102 and feedback path 104 within the modulator 300 can be obtained by a compromise of SNR at larger signal input levels, as enabled by the DAC component 106, despite the larger input levels being a constant or dynamically changed. By unavoidable mismatches in the resistor values the floating feedback voltage may show non-idealities that can lead to an increase in signal distortion, if more than only the inner two resistors are used to mitigate a larger input voltage. Under such a condition THD is compromised and a degradation of the SNDR applies.

Figure 4:
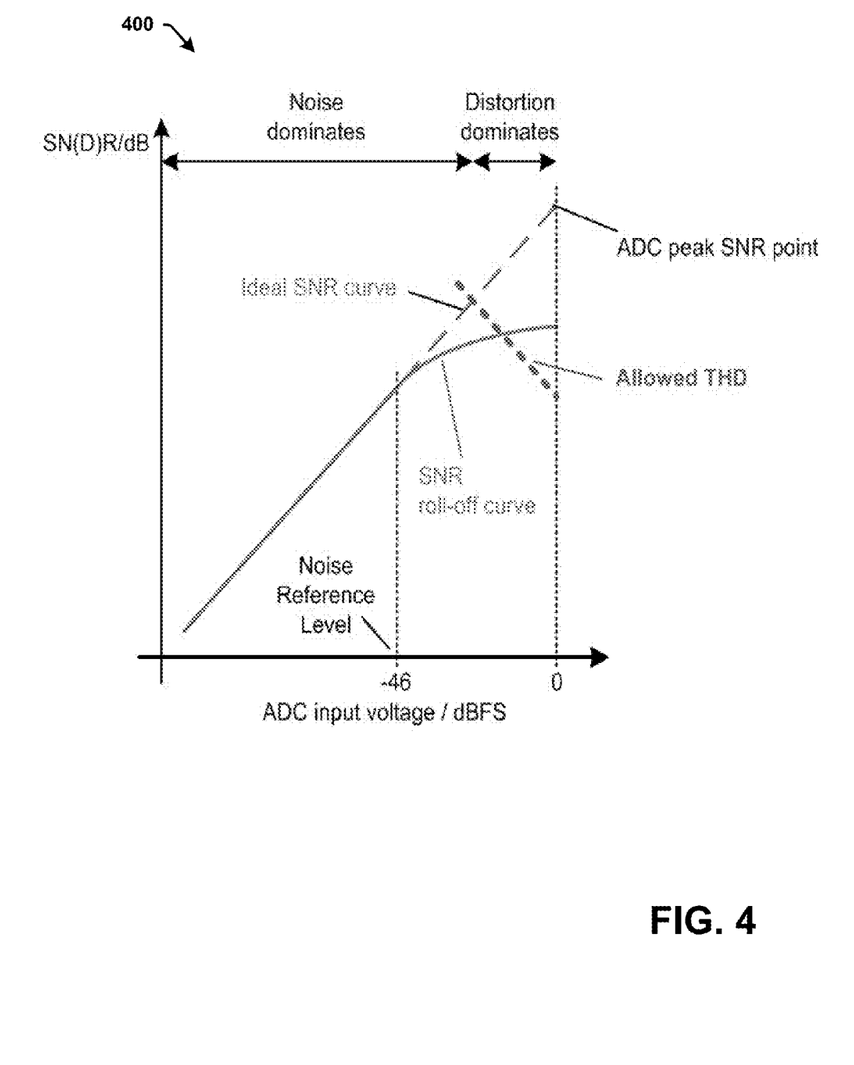
FIG. 4 is graph illustrating a signal to noise power with respect to an input voltage according to various aspects described.

Before continuing the discussion of FIG. 3, an example is illustrated in FIG. 4 of a graph 400 of potential compromising scenarios that can be implemented by the feedback DAC 106 in accordance with various aspects being described. The graph 400 provides points for discussion regarding the properties of SNR and SNDR to illustrate embodiments for compromising SN(D)R with the components of the audio systems being described, and, in particular, audio systems with components for switched capacitor modulators, for example, which can further comprise multi-bit components. Various components described herein can operate along such properties described.

The "ideal SNR curve" of FIG. 4 illustrates the ideal monotonic increase of the SN(D)R of an analog-to-digital converter (ADC) system or the modulator 300 as described herein, for example, as a function of input signal level (e.g., input signal 110), which is given in dBFS. In this ideal ADC the linear increase in SNDR over input signal level relates to a constant noise level at all signal levels and the absence of distortion. The SN(D)R axis increases up to a maximum input amplitude, either determined by the properties of the ADC or the ADC's full-scale level 0 dBFS, as shown in the example. At small input signals the SNDR is dominated by noise (i.e., SNDR=SNR), as illustrated by the horizontal bi-directional arrow indicating the ranges labeled by and for which "Noise dominates." At high signal levels distortion dominates (i.e., SNDR=THD).

The noise performance of the modulator system can be evaluated with respect to a system specific reference level (e.g., "Noise Reference Level"), which can be defined in relation to the ADC's full-scale level. For example, the noise power at a sound pressure of 1 Pa (94 dBSPL) could be used as a reference and referred to an ADC level of such as about −16 dBFS. If the input signal full scale range is increased to obtain a higher dynamic range in a modulator component in which a condition or criterion or such by the DAC 106 or other modulator 300 component could be—at least in acoustic systems—to maintain the absolute power of the "Noise Reference Level" signal constant. Thus, increasing the dynamic-range by 20 dB moves the "Noise Reference Level" signal position from −16 dBFS to −36 dBFS.

In one embodiment, the modulator 300 facilitates compromise of the SNR and/or the SNDR (=THD) at higher input signal levels by selection of the "Noise Reference Level" or threshold level. The "SNR roll-off curve" is one example of such a scenario, in which the DAC 106 operates to provide a cap, or a governor to the obtainable SNR by adding noise at large input signal levels. In such a case, analog noise and/or THD are increasing at higher signal levels causing the SNR (or SNDR) curve to show an inhibition or a roll-off at input voltage increases where SNDR=THD. Additionally, at input signal levels below the reference level, a system with compromised SN(D)R at higher levels operates to provide SNDR=SNR as a non-compromised setup, in which the "Ideal SNR curve" and the "SNR roll-off curve" are similar.

A linear-in-dB SNR relation can be obtained by the modulator 300, for example, in response to the analog noise power being constant in a range of input signal amplitudes. In aspects disclosed, the modulator 300 can be configured to ensure that the ADC's (modulator's) quantization noise is significantly lower than the analog noise at an input terminal even at low input levels. The higher the dynamic range of the modulating system, the more complicated it is to obtain the "Ideal SNR curve" SNR relation, as higher input levels distortion begins to dominate and SNDR=THD. If the dynamic range is extended by increasing the modulator reference voltages (e.g., in absolute value), then the power of the quantization noise increases also and at some dynamic range quantization noise dominates over the analog noise at low input signal levels. This problem can be overcome by selection of high bit-count modulator structures, i.e. using multi-bit delta-sigma modulators with 4, 5 or even 6 bit output codes M 112. Thus, it can be assured that the quantization noise at all signal levels is significantly below the analog noise.

Referring back to FIG. 3, when properly centered the A/D modulator system 300 can operate in a single-bit mode at signal levels at or below a threshold level, for example, about 10 dB above the "Noise Reference Level", and in a multi-bit mode at input levels above this threshold. In the single-bit mode of operation, the amount of series resistance can be constant, and kept to a minimum (e.g., 1 Kilo-Ohms or a like resistance). Here, the SNR follows the linear-in-dB increase with signal level increase. In addition, the series resistance value for small input signals can be very small because only the first selection (resistance level) point up and the first selection resistance point down from the center are selected. Unit resistors of 2 kΩ and below can be feasibly selected by the modulator code component 314 by control of the switches 312 without leading to a large AC input current and maintaining small shift currents Ishift. Furthermore, in a differential arrangement only a ½ least significant bit (LSB) resistor unit is in series to every signal input leading to an additional incremental improvement, such as a 3 dB noise improvement, for example. The additional amount of noise added to the remaining circuit noise is therefore small, even more so for high bit-count multi-bit modulators 300.

At small signal levels, e.g. at or below a threshold set slightly above the Noise Reference Level, a multi-bit modulator 300 can operate in a single-bit mode and obtain perfect linearity in the DAC 106. If additional codes are engaged at higher signal levels, then the THD is affected due to the non-idealities in the transfer curve of the R-shift DAC 106. However, if a THD of 60 to 70 dB at large signal levels is sufficient for an application, then the DAC 106 as a floating-voltage-source feedback-DAC can be designed based on matching of the resistor units in the resistor string 310

An ideal ADC with constant noise level and negligible distortion obtains the SNR characteristic named "Ideal SNR curve" in FIG. 4. Implementation of such ADCs typically can require a 4-times increase in power per doubling of the input signal range. For example, considering an ADC with a full-scale level of 120 dBSPL and a power consumption of 450 µA the required power supply current would be 100-times higher if the dynamic range is increased 10-times to 140 dBSPL, if a constant is assumed. By tolerating increased noise and distortion at higher input signal levels, a significant power saving can be achieved, for example, leading to an ADC that consumes only 2-times more power while supporting 10-times higher dynamic range.

Another parameter or further embodiment of the DAC 106 as a floating-voltage-source R-shift DAC is that the resistors of the resistor string 310 are dynamically selected as a function of the modulator output code provided, for example, by the modulator code component 314. If the modulator typically toggles only a few LSBs at any operating point only adjacent switches are toggling. The amount of voltage change at the output is thus relatively small, which can limit dynamic effects. Thus, a high bit-count multi-bit modulators can be advantageous to minimize these voltage steps such as with a multi-bit ADC, a quantizer or a quantization component 304. Furthermore, a high bit-count multi-bit modulator has superior quantization noise in comparison to e.g. a single-bit modulator due to the small LSB level in comparison to full-scale level, which determines the quantization noise in a single-bit modulator.

The modulator path 102 comprises a loop filter 302 and an ADC 304. The analog input signal 110, as provided, for example, by the interface 208, can be processed by the modulator 300 to minimize the voltage difference at the output of the summing component 303 (or "S"). On average, the analog input signal is 'tracked' by the an output value "D" of the DAC 106, which is put in series to the input signal 110, and, due to the fixed transfer curves of DAC versus the ADC 304, also by a signal at the input (A) of the multi-bit ADC 304. By the introduction of additional bits the input signal dynamic range can be increased. The relation between the analog input swing and an input range of the ADC 304 can be determined by the gain between the output D of the DAC 106 and the input A of the ADC 304. Therefore, the signal swing at the input of the multi-bit ADC 304 can be minimized by selection of a larger DAC gain compared to the ADC gain via the DAC 106, for example. This enables low-voltage operation of the multi-bit ADC 304 and the Loop-Filter 302, e.g. a supply of 1.5 V is feasible, which minimizes power consumption despite additional voltage or voltage swings being supplied from the interface component (e.g., a MEMS interface component). To minimize dynamics introduced by the high-frequency part of the quantization noise, the modulator 300 can use as high as possible bit-count, e.g. 6 bit, for a high-dynamic range.

In an aspect, a power efficient architecture of a multi-bit ADC can provide a so-called 'Tracking ADC' structure in the modulator path 102. For applications requiring low over sampling ratio (OSR), the tracking ADC 304 can be designed with a set of parallel comparators (not shown) and a reference voltage network that is dynamically adjusted by consideration of the output state of the individual comparators. Using such architecture, the multi-bit ADC 304 can be designed with up to 6 bit word width, for example, while comprising five comparators for operation.

Figure 5:
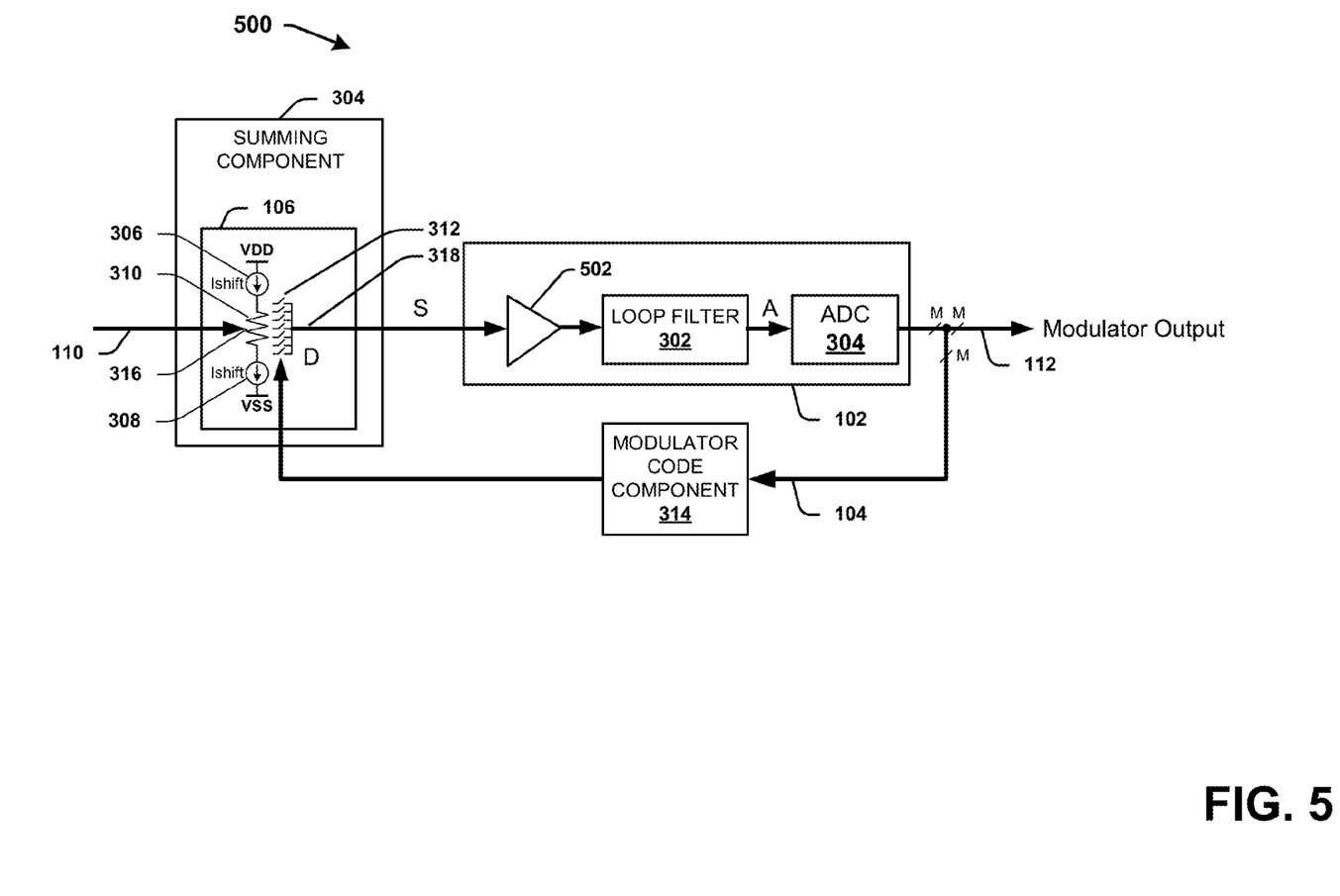
FIG. 5 is another block diagram illustrating a modulator according to various aspects described.

The loop filter 302 can operate to receive the output of the summing node and thus loads the DAC output from the output tap 318, for example. Referring now to FIG. 5, is another embodiment of a modulator 500 that operates to dynamically compromise SDNR at high signal swings in accord with various aspects. The modulator 500 comprises similar components as discussed above, in which the modulator path 102 further comprises a continuous time buffer 502 between the feedback DAC 106 and the loop filter 302. To eliminate some disadvantages of continuous-time modulators, clock jitter dependency and loop-filter coefficient variations, the loop filter 302 can comprise a switched-capacitor loop filter 302. In this switched-capacitor implementation, the loop filter 302 can comprise multiple integrators (not shown), for example, in which the first integrator's sampling capacitance loads the output of the R-Shift Feedback-DAC 106 by a constant capacitive load that can be charged once or twice per clock cycle, with single- or double-sampled systems, respectively. But as the output resistance of the resistor string 310 and switches 318 of the DAC 106 are signal dependent, the settling of the sampling capacitance can be critical at larger signal levels and high sampling rates. As such, the continuous-time buffer 502 can be optionally inserted between the feedback-DAC 106 and the loop filter 302 to avoid settling problems. In an embodiment, because the buffer 502 can be integrated as part of the loop filter 302, its gain variations are not as critical, and, in one aspect, the buffer 502 can comprise a simple source-follower, for example.

Low-frequency noise (1/f noise) and DC offset of the buffer 502 can be mitigated by application of chopping or double-sampling techniques in the modulator 500. Though the buffer 502 adds to the power-consumption, it is already located in a low-voltage power supply domain, and so the power burden is relatively small. With the introduction of the buffer 502, the loop filter 302 is further isolated from the summing node S. Therefore, the input impedance of the total modulator 500 is very high resistive at DC and low frequencies and relatively small capacitively at higher frequencies. This enables operation of the interface component 208 with drivers (e.g., voltage drivers) with moderately high output impedance, which leads to lower power implementations and enables use of internal voltage multiplication circuits for the supply voltage generation, supporting even higher signal swings, as further illustrated and described infra. Additionally, the floating-voltage-source R-shift DAC 106 to dynamically provide a voltage feedback in response to input swings can be applied to high bit-count designs, as with multi-bit modulator pathway(s)/pipeline(s) comprising the modulator path 102. The achievable modulator bit-count is not configured by the DAC 106, for example, but limited by the multi-bit ADC 304. In practice, a bit count of 6 bit can be assumed as a practical maximum, although other and higher bit counts can be envisioned. Thus either very large input voltage levels can be supported, or the LSB voltages of the system can be reduced, which reduces quantization noise further and thereby minimizes possible unwanted modulator effects, like tonal behavior. The floating voltage source feedback DAC 106 coupled to a switched-capacitor multi-bit modulator overcomes multiple disadvantages of continuous-time modulators using current-steering feedback I-DAC structures. For emphasis, the input current into the modulator 500 is very small to zero, even at large signal levels.

With the floating voltage source feedback DAC 106, the modulator 500, modulator and systems described herein can operate to use a single low-power high bit-count multi-bit switched-capacitor delta-sigma modulator to measure input signals with a very high dynamic range, e.g. 112 dB, a very good SNDR (i.e., analog noise and distortion) in which around and below small reference levels (e.g. −46 dBFS) can be maintained due to the small series resistance of the resistor string 312 for the DAC 106 (also as an R-shift DAC) in single-bit operation. Large currents flowing in the input branches of standard high-swing continuous-time multi-bit modulators can be avoided, especially at high input signal levels. The input impedance of the proposed circuit can be very high, even at large input signal swings, which allows simple and noise efficient pre-amplifier designs as part of the interface component 208 for driving a signal (e.g., a MEMS signal) into the ADC 300 or 500.

Because the feedback voltage can be generated by a dynamic adaptation of the resistance of the resistance string 310 of the DAC 106, a small shift current is sufficient. For example, in a differential 6-bit implementation of the R-shift DAC 106 using a unit resistor of 2 kΩ, a shift current of 27.7 μA is sufficient in both branches to support an input signal range of 3.56 Vpkdiff (peak differential). This minimizes power consumed in the driving circuits and allows system power optimization of modulator systems.

To minimize power consumption, the modulators disclosed can facilitate compromises that can include SNR compression at higher signal levels due to adding series resistances, such as within the resistor string 310, and increase in THD at higher signal levels in multi-bit mode due to DAC non-idealities.

Additionally, the floating voltage source feedback DAC 106 of the modulator 500 can operate to use a single bit mode in the modulator path 102 when signal input levels are at or below a threshold, while additional bits are allocated for use at operation above that threshold. Embodiments of the modulator disclosed can replace dual-ADC (low-gain/high-gain) setups, which suffer from non-idealities affecting the SNR at the transition point from one to the other ADC, as well as continuous-time multi-bit sigma-delta/delta-sigma modulators that have a main disadvantage of low input impedance utilized to maintain low analog noise power which leads to a large loading of the circuit driving input signal 110. The switched-capacitor multi-bit modulator 500 with a floating voltage source R-shift DAC as a feedback DAC as disclosed thus provides various advantages as follows:

1. Robustness against clock-jitter;
2. Robust setting of modulator coefficients based on capacitance matching;
3. Very high modulator input impedance enabling maximum flexibility in the design of the input signal driver;
4. Very low power consumption for the generation of high voltage offsets required at very large input signals to maintain an 'AC-GND' at the summing node "S" at the input of the loop-filter of the delta-sigma modulator;

5. Input driver load independent of input signal level;

6. Small additional circuit noise at small to medium large signals due to very small series resistance and highly degenerated current sources;

7. Very good linearity and noise at small to medium large signal, at which the multi-bit modulator is operating in single-bit mode; and 8. THD exceeding 60 dB at higher input signal levels obtained solely by device matching.

Figure 6:
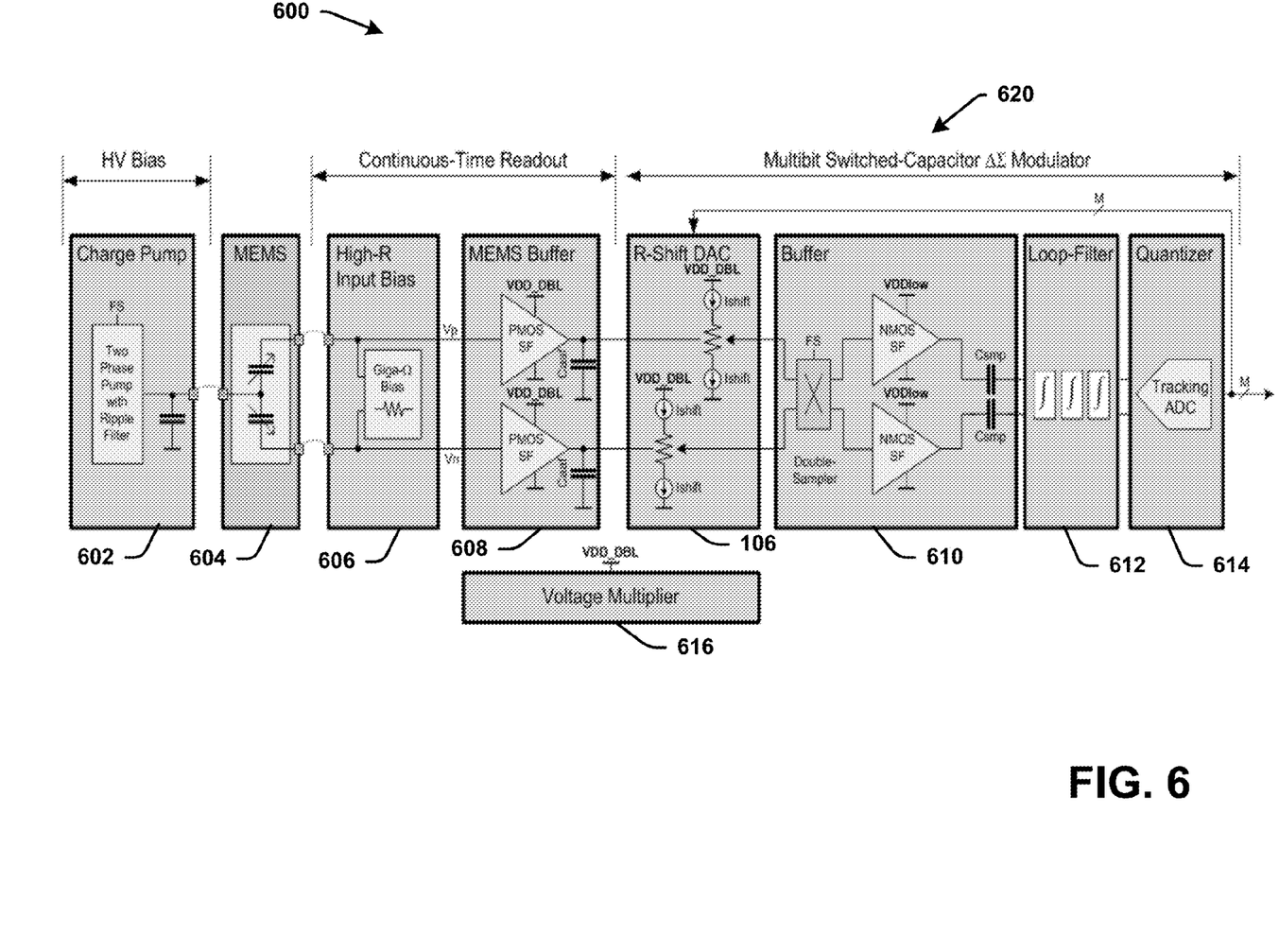
FIG. 6 is illustrating another audio system in accordance with various aspects described.

Referring now to FIG. 6, illustrated is another example of a differential audio system 600 according to one example. The system 600 can operate compromises described above that can be accepted in systems without a continuous gain of SN(D)R and low THD with rising input signal level. The system 600 can operate with a relatively good THD, e.g. <0.1% (−60 dB), and SNR (>66 dB) at small to medium to large signal levels below about 104 dBSPL, with a reference level of 94 dBSPL mapped to an ADC readout of −46 dBFS and an input range up to 140 dBSPL, in which at SPLs above ~110 dBSPL the THD could increase and at 120 dBSPL THD in the low % target range is acceptable. At full-scale 140 dBSPL the THD may reach 20%, in which these values can easily be supported by the floating-voltage-source R-shift DAC 106 architecture by proper sizing (i.e., matching) of the resistor units of the resistor string 310. Due to the dominance of the strong distortion at sound pressure levels above ~120 dBSPL an SNR reduction can be implemented via the modulator components such as the DAC 106.

The differential audio system 600 can be a microphone (e.g., a digital silicon microphone) that comprises a MEMS 604 and an application specific integrated chip (ASIC), which incorporates a high voltage bias 602, a continuous-time MEMS interface (606, 608), a multi-bit switched capacitor delta sigma modulator (106, 610, 612, 614) and a voltage multiplier (616). The ASIC can provide a high-voltage bias to the MEMS 604 via the charge pump 602. The MEMS sensor 604 provides a voltage signal as a differential signal to the ASIC's readout components via a differential pathway. The MEMS circuit 604 comprises a dual-back plate MEMS for example. The bias voltage is fed to the membrane of the MEMS 604 via the charge pump 602. The top and the bottom backplates are connected to the ASIC input nodes (Vp and Vn) respectively, at which a Giga-Ohm Bias circuit 606 provides a voltage operating point (e.g., about 0.5 V). At the end of a charging phase, in which both the charge pump 602 and the Giga-Ohm Bias circuit 606 are set to low impedance, both components are switched into high impedance mode, and thus a charge is trapped on both MEMS capacitances of the MEMS circuit 604. With a movement of the membrane, the capacitor values change and a voltage can be read at the ASIC input using a MEMS Buffer 608 with a very high input impedance. This buffer 608, e.g. a PMOS source-follower, can operate to drive the multi-bit switched capacitor delta sigma modulator 620 that incorporates the floating-voltage-source R-Shift feedback-DAC 106, a buffer 610, a loop filter 612 and quantizer (e.g., a tracking ADC) 614.

In an aspect, the system 600 includes a differential signal path as a modulator path and a feedback path to the DAC 106 as discussed above. The MEMS buffer 608 can provide a differential voltage to the ADC or modulator 620, in which the MEMS buffer 608 and the DAC 106 are supplied by an on-chip voltage multiplier 616 that generates supply node VDD_DBL, e.g. by a charge pump. The DAC output is buffered by an NMOS source-follower, which can be provided to a summing node and be embedded in a double-sampling structure, for example. Together with the two-phase sampling/auto-zero and integration operation of the first switched-capacitor integrator of the loop filter 612 the system 600 operates to cancel DC offset and low-frequency noise of the NMOS source-follower. The loop filter 612 can be a third order filter, for example, and the quantizer or multi-bit ADC 614 can operate as a 6 bit tracking ADC to generate a digital output as described above.

In normal microphone applications, the voltage swing to be processed is relatively small in such a way that a voltage swing present at the input of the ADC or modulator 620 and the voltage differential at the input is directly related to the SPL that a microphone can capture. Typical speech is at SPLs below about a level of 94 dB SPL. However, loud communications such as loud music can go up to a level of about 120 dB SPL, which can vary depending on how the MEMs sensitivity is set to voltages in the range of a few hundred millivolts peak differential coming out of the MEMS. For example, even with 1.5 volt supply and a small voltage application the circuit is able to handle these voltages. However, if very loud sound has to be processed (e.g., a SPL of up to 140 dBSPL) then the voltage level increases by 20 dB, and thus the signal swing at the MEMS can obtain several Volts. By supplying the MEMS Buffer circuit 608 from an internal supply voltage VDD_DBL generated by voltage multiplier 616 those larger signals can be fed to the delta sigma modulator. The voltage multiplier 616 operates with the DAC 106 to generate a floating voltage as a voltage source in series to the input signal to the modulator path and adjust/moderate the floating voltage as a function of a change in a signal value of the analog signal for high peak voltage inputs.

The DAC 106 modifies a resistance (e.g., a total resistance) as a function of the analog signal provided by the MEMS buffer 608 to maintain a small voltage swing in the range of several LSBs of the multi-bit modulator, for example some 100 mV, at the input of the buffer 610 that drives the modulator loop filter. The DAC 106 can facilitate a cap or an inhibition to the SNR by enabling additional noise at increased input signal power. In this manner, the DAC 106 operates to generate a compromise between signal power and noise (SN(D)R) as a function of the input level. The DAC 106 is illustrated as having two different resistor strings with corresponding current sources Ishift as discussed above with respect to each differential signal path comprising opposite polarities, for example. The buffer 610 receives the output of the summing component that moderates the voltage swings of the input to the DAC 106 with one or more similar voltages of same or opposite polarity in order to reduce the input signal to a small signal for operation of the buffer 610, loop filter 612 and quantizer 614. The DAC 106 generates the modulation by controlling different resistors of the resistor strings in each path, as resistors are added in series while the noise also is increased from the additional resistors placed in series to the outputs of the MEMS buffer. Therefore, a high powered audio system is able to operate with low power consumption with high voltage swings at high signal levels without utilizing more than one modulator or more than one signal path or differential path with corresponding modulation components (e.g., the DAC 106, or the quantizer 614).

Figure 7:
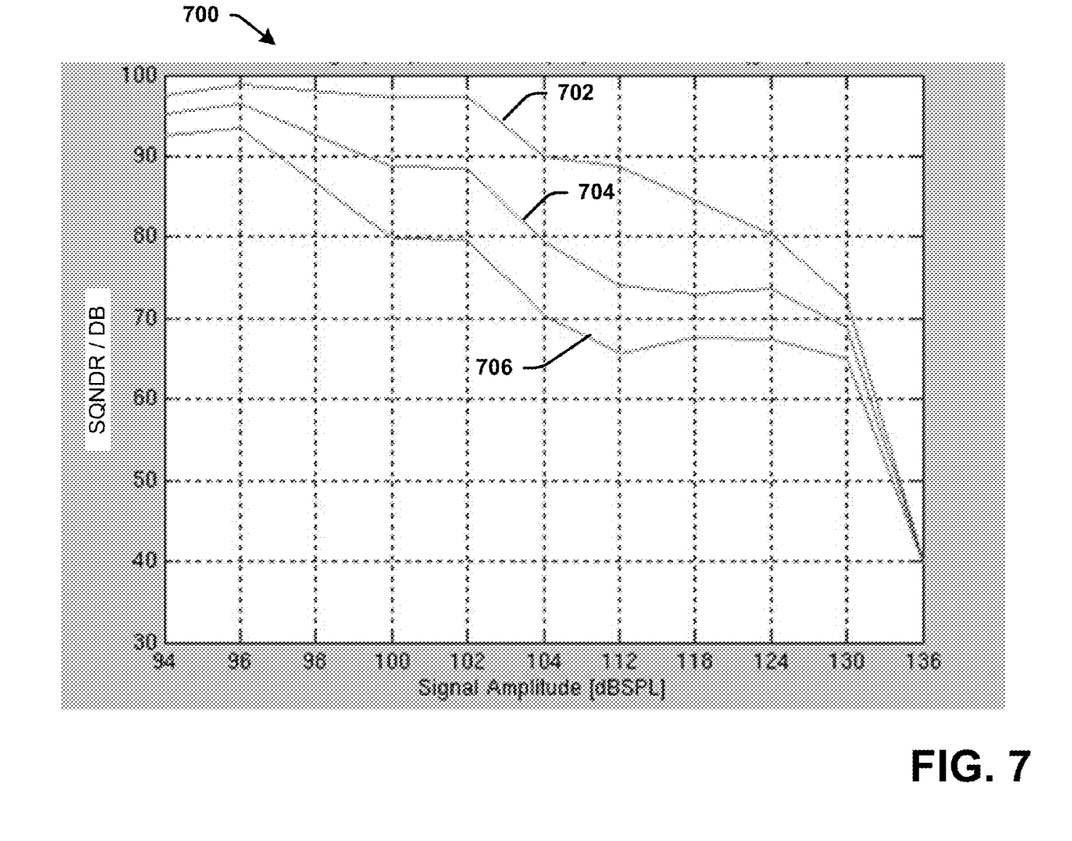
FIG. 7 is a simulation graph according to various aspects described.

With the intention of understanding the DAC's mismatch affect to the obtainable THD (i.e., SNDR at higher signal levels), a set of Monte-Carlo simulations had been performed of the modulator that is implemented by sweeping input signal amplitudes from 94 dBSPL (−46 dBFS) to 136 dBSPL (−4 dBFS). FIG. 7 illustrates a graph of the outcome of those simulations according to various aspects described.

The graph 700 illustrates a comparison of SQNDR (Signal to Quantization Noise) in dB units of measure versus signal amplitude in dBSPL units of measure via 40 Monte-Carlo simulation runs per signal level unit. The curve 702 represents the best case scenario results or a top tier of results for each signal level, while the curves 704 and 706 represent an average level and a worst level of the results respectively.

The simulation 700 illustrates that the modulator, as discussed herein, can operate to stay in a single-bit mode up to 96 dBSPL, in which the modulator path described above processes a single bit at a time and no distortion degradation due to mismatches is visible. At 98 dBSPL, the modulator path and components therein start operating in a multi-bit mode of operation, which causes the SQNDR to drop. In an input range between 98 to 100 dBSPL quantization noise floor increases because of the mismatch of the LSB steps. Above 104 dBSPL the SQNDR is dominated by distortion originating from the DAC's transfer curve mismatch, i.e. the integral non linearity (INL). Up to an input level of 130 dBSPL, the SQNDR (THD+Quantization-Noise) stays well above 60 dB (0.1%) with excellent levels of >90 dB in single-bit mode.

Another embodiment of the R-shift DAC 106 can comprise of combinations of fixed current sources (Ishift), connected to the top and bottom end of the resistor string (e.g., 310), and adjustable current sources connected to a top (first) and a bottom (second) of two center resistors, for example, of the resistor string 310 that are driven by the input signal 110. The control of the switches tapping the resistor string (e.g., 310) and/or the value of the adjustable current sources can be performed by the modulator code component 314. The adjustable current sources connecting to the LSB resistors and dynamic element matching can be applied to those current sources as to mitigate non-idealities, for example, mismatches between the adjustable current sources thus obtaining improved integral nonlinearity (INL) of the DAC leading to improved THD at cost of a higher power consumption.

While the methods described within this disclosure are illustrated in and described herein as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

Figure 8:
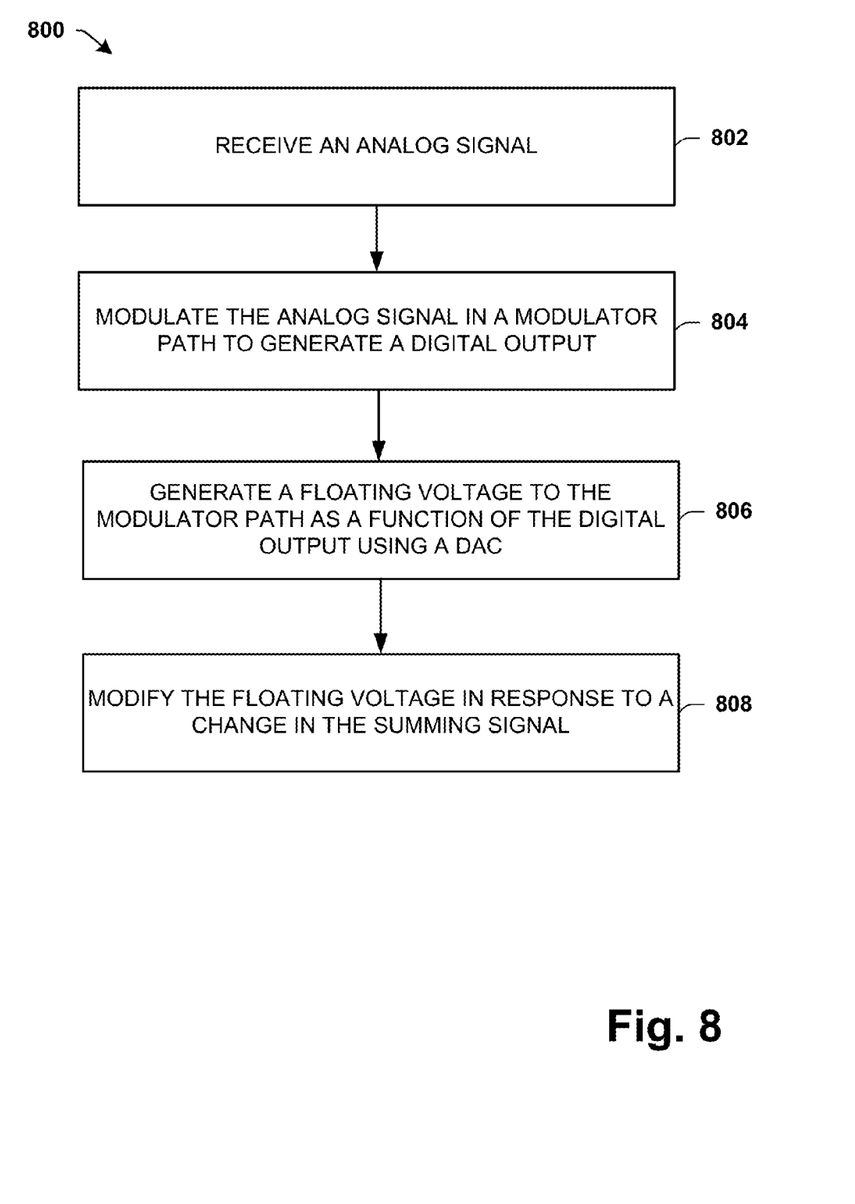
FIG. 8 is a flow diagram illustrating another method of modulator according to various aspects described.

Referring to FIG. 8, illustrated is a method 900 that enables a single low-power high bit-count multi-bit switched-capacitor delta-sigma modulator or ADC to measure input signal with a large dynamic range (e.g., about 112 dB). The method 800 initiates and at 802 comprises receiving, at an analog input of a modulator, an analog signal derived from a sensor (e.g., a MEMS audio sensor).

At 804, the analog signal is modulated in a modulator path to generate a digital output signal.

At 806, a floating voltage is generated by the DAC in a feedback path to the modulator path as a function of the digital output.

At 808, the floating voltage is modified by the digital to analog converter in response to a change in the analog input signal or a summing signal at a summing node.

In further embodiments, a DAC is configured to select a set of resistors of a resistor string by controlling a set of switches in response to an digital output code of a modulator and the absolute voltages tapped at the resistor string may increase in a monotonic linear manner, e.g. same voltage increase per LSB, or a monotonic non-linear manner (e.g. the voltage steps are increasing in a non-linear manner like a quadratic or exponential form). The increased systematic distortion generated by the non-linear implementation could be tolerated in some systems.

The above description of illustrated embodiments of the subject disclosure, including what is described in the Abstract, is not intended to be exhaustive or to limit the disclosed embodiments to the precise forms disclosed. While specific embodiments and examples are described herein for illustrative purposes, various modifications are possible that are considered within the scope of such embodiments and examples, as those skilled in the relevant art can recognize. In this regard, while the disclosed subject matter has been described in connection with various embodiments and corresponding Figures, where applicable, it is to be understood that other similar embodiments can be used or modifications and additions can be made to the described embodiments for performing the same, similar, alternative, or substitute function of the disclosed subject matter without deviating therefrom. Therefore, the disclosed subject matter should not be limited to any single embodiment described herein, but rather should be construed in breadth and scope in accordance with the appended claims below.

In particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature may have been disclosed with respect to only one of several implementations, such feature may be combined with one or more other features of the other implementations as may be desired and advantageous for any given or particular application.

What is claimed is:

1. A modulator comprising:
   an analog input configured to receive an analog input voltage;
   a modulator path, comprising a modulated digital output, configured to generate a modulated digital output signal at the modulator digital output; and
   a feedback path, coupled to the modulated digital output, comprising a digital-to-analog converter configured to generate a floating voltage as a function of the modulated digital output signal.

2. The modulator of claim 1, further comprising:
   a summing node configured to receive the analog input voltage and generate a voltage to the modulator path as a function of the analog input voltage of the analog input and the floating voltage of the feedback path.

3. The modulator of claim 1, wherein the digital to analog converter is configured to compromise analog noise and total harmonic distortion in response to the analog input voltage exceeding a predetermined threshold.

4. The modulator of claim 1, wherein the digital to analog converter further comprises:
   a resistor string coupled to the analog input comprising a set of resistors coupled to one another;

a first current source, coupled to a first end of the resistor string, configured to generate a first current;
a second current source, coupled to a second end of the resistor string, configured to generate a second current; and
configured to provide a set of voltage levels to the modulator path.

5. The modulator of claim 1, wherein the analog input is coupled to a resistor string at a center tap located at an approximate center of the resistor string.

6. The modulator of claim 1, further comprising:
a resistor string, coupled to the analog input, configured to generate a set of voltage levels to the modulator path based on a state of a plurality of switches that selectively provide the set of voltage levels to the modulator path at an output tap of the digital to analog converter.

7. The modulator of claim 6, further comprising:
a modulator code component configured to generate a switching code that controls the state of the plurality of switches and select which output tap of the resistor string to provide the floating voltage to the modulator path from the digital to analog converter,
wherein the plurality of switches is configured to provide an offset voltage to the output tap to modify an input voltage of the analog input as a function of the state of the plurality of switches, the first current of the first current source or the second current of the second current source, and a total resistance between a center tap of the resistor string and the selected output tap.

8. The modulator of claim 6, wherein the digital to analog converter further comprises selective combinations of fixed current sources connected to a first end and a second end of the resistor string and adjustable current sources connected to a top and a bottom of at least two center resistors of the resistor string that are driven by the input signal and are controlled by a modulator code to mitigate non-idealities, or mismatches between the adjustable current sources leading to improved THD at a cost of a higher power consumption.

9. The modulator of claim 1, wherein the digital to analog converter comprises a constant power supply current, and is further configured to generate an analog noise contribution that increases in response to the signal value of the analog input voltage at the analog input satisfying a predetermined threshold.

10. The modulator of claim 1, wherein the modulator path comprises:
a continuous time buffer coupled to an output of a summing node that combines the floating voltage and the analog input voltage of the analog input;
a switched capacitor loop filter configured to receive an output of the continuous time buffer and load the output of the continuous time buffer with a sampling capacitance at a first integrator to generate a filtered output; and
a multi-bit analog to digital converter configured to quantize an analog output of the switched capacitor loop filter and generate a multi-bit digital output.

11. An audio system comprising:
an analog input configured to receive an analog input voltage;
a modulator component, comprising a modulated digital output, configured to generate the modulated digital output; and
a feedback component, coupled to the modulated digital output, comprising a digital to analog converter configured to generate a floating voltage and moderate a voltage swing from the analog input voltage at the analog input to the modulator path with the floating voltage.

12. The audio system of claim 11, wherein the digital to analog converter is configured to modify a resistance as a function of the analog input voltage at the analog input to adjust the floating voltage.

13. The audio system of claim 11, further comprising:
a acoustic sensor configured to detect an audio signal as a function of an electrical signal generated from a membrane change;
a buffer, with gain or attenuation or unity gain, comprising an input impedance that facilitates communication of the electrical signal to the modulator component; and
a high-voltage charge pump configured to supply a bias voltage to the acoustic sensor; and
a voltage multiplier configured to supply the buffer and the digital to analog converter of the feedback path.

14. The audio system of claim 11, wherein the digital to analog converter is configured to compromise an increase in a noise power or a total harmonic distortion in response to the analog input voltage satisfying a predetermined threshold.

15. The audio system of claim 11, wherein the modulator component comprises:
a switched capacitor loop filter configured to load the floating voltage with a sampling capacitance to generate a filtered output; and
a multi-bit analog to digital converter configured to quantize an analog output of the switched capacitor loop filter and generate a multi-bit digital output.

16. The audio system of claim 11, wherein the feedback component further comprises:
a resistor string comprising a set of resistors configured to selectively provide one or more voltage levels to the modulator path as a function of the analog input voltage; and
a summing node configured to receive the analog input voltage and generate a voltage as a function of the analog input voltage of the analog input and the floating voltage of the feedback path.

17. The audio system of claim 11, wherein the feedback component further comprises:
a resistor string, coupled to the analog input, configured to selectively provide one or more voltage levels to the modulator path as a function of the analog input voltage;
a first current source, coupled to a first end of the resistor string, configured to generate a source current to the resistor string; and
a second current source, coupled to a second end of the resistor string, configured to generate a sink current from the resistor string.

18. The audio system of claim 17, further comprising:
an modulator code component configured to control one or more switches of the resistor string to facilitate the one or more voltage levels to provide an offset voltage to the summing node to modify the analog input voltage of the analog input.

19. The audio system of claim 11, wherein the feedback component is further configured to moderate the voltage swing from the analog input voltage at the analog input to the modulator path with the floating voltage and is compromising a noise and distortion power in response to the analog input voltage satisfying a voltage threshold.

20. A method comprising:
receiving, at an analog input of a modulator, an analog signal derived from a sensor;
modulating the analog signal in a modulator path to generate a digital output signal at a digital output;
generating a floating voltage via a digital to analog converter in a feedback path to the modulator path as a function of the digital output; and
modifying the floating voltage generated by the digital to analog converter in response to a change in a summing signal of a summing node coupled to the modulator path.

21. The method of claim 20, further comprising:
generating a negative feedback at the summing node of the modulator path in response to the analog signal.

22. The method of claim 20, further comprising:
controlling a voltage at the summing node that receives the analog signal by moderating the floating voltage in response to a predetermined threshold being satisfied and compromising to obtain a noise power with a signal power.

23. The method of claim 20, further comprising:
selecting a set of resistors of a resistor string by controlling a set of switches in response to an output code of a modulator code component; and
generating the output code to operate the set of switches as a function of a summing voltage at the summing node.

24. The method of claim 20, further comprising:
filtering the modulator path with a loop filter comprising a plurality of integrators; and
quantizing an analog output of the loop filter with an analog to digital converter with multiple bits concurrently in the modulator path to generate the digital output.

25. The method of claim 20, further comprising:
modifying a resistance of the digital to analog converter to adjust the floating voltage as a function of a change in the digital output.

* * * * *